(12) United States Patent  
Ossmann et al.

(10) Patent No.: US 9,110,378 B2  
(45) Date of Patent: Aug. 18, 2015

(54) ILLUMINATION OPTICAL SYSTEM FOR PROJECTION LITHOGRAPHY

(71) Applicant: Carl Zeiss SMT GmbH, Oberkochen (DE)

(72) Inventors: Jens Ossmann, Aalen (DE); Martin Endres, Koenigsbronn (DE); Ralf Stuetzle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 157 days.

(21) Appl. No.: 13/894,120

(22) Filed: May 14, 2013

(65) Prior Publication Data

US 2013/0250262 A1    Sep. 26, 2013

Related U.S. Application Data

(63) Continuation of application No. PCT/EP2011/071714, filed on Dec. 5, 2011.

(60) Provisional application No. 61/421,702, filed on Dec. 10, 2010.

(30) Foreign Application Priority Data

Dec. 10, 2010   (DE) .................... 10 2010 062 779

(51) Int. Cl.
*G03B 27/54*     (2006.01)
*G03B 27/42*     (2006.01)
*G03F 7/20*      (2006.01)

(52) U.S. Cl.
CPC ........ *G03F 7/70141* (2013.01); *G03F 7/70058* (2013.01)

(58) Field of Classification Search
CPC ............ G03F 7/70116; G03F 7/70433; G03F 7/70191
USPC ................... 355/52, 53, 55, 67–71
See application file for complete search history.

(56) References Cited

U.S. PATENT DOCUMENTS 8,717,541 B2 * 5/2014 Staicu et al. .................... 355/67
2008/0049206 A1   2/2008 Ossmann
(Continued)

FOREIGN PATENT DOCUMENTS

DE    10 2008 013 229 A1   6/2009
WO    WO 2009/074211       6/2009
WO    WO 2010/037453       4/2010

OTHER PUBLICATIONS

German Examination Report, and English translation thereof, for corresponding DE Application No. 10 2010 062 779.8, dated Aug. 10, 2011.

(Continued)

*Primary Examiner* — Hung Henry Nguyen
(74) *Attorney, Agent, or Firm* — Fish & Richardson P.C.

(57) ABSTRACT

An illumination optical system for projection lithography has an optical assembly for guiding illumination light to an object field to be illuminated in an object plane. The illumination optical system divides a bundle of the illumination light into a plurality of part bundles, which are allocated to various illumination directions of the object field illumination. The illumination optical system is configured in such a way that at least some of the part bundles are superimposed on one another in a first superimposition plane according to a first superimposition specification and in a second superimposition plane, which is spaced apart from the first superimposition plane, according to a second superimposition specification. The result is an illumination optical system, in which an influencing and/or a monitoring of an illumination intensity distribution over the object field is made possible, as far as possible without influencing an illumination angle distribution.

24 Claims, 9 Drawing Sheets

(56) References Cited

U.S. PATENT DOCUMENTS

2009/0303450 A1* 12/2009 Hintersteiner .................. 355/30
2010/0253926 A1* 10/2010 Endres et al. ................... 355/67
2010/0265482 A1* 10/2010 Schubert et al. ................ 355/67

OTHER PUBLICATIONS

The International Search Report for the corresponding PCT Application No. PCT/EP2011/071714, mailed May 7, 2012.

* cited by examiner

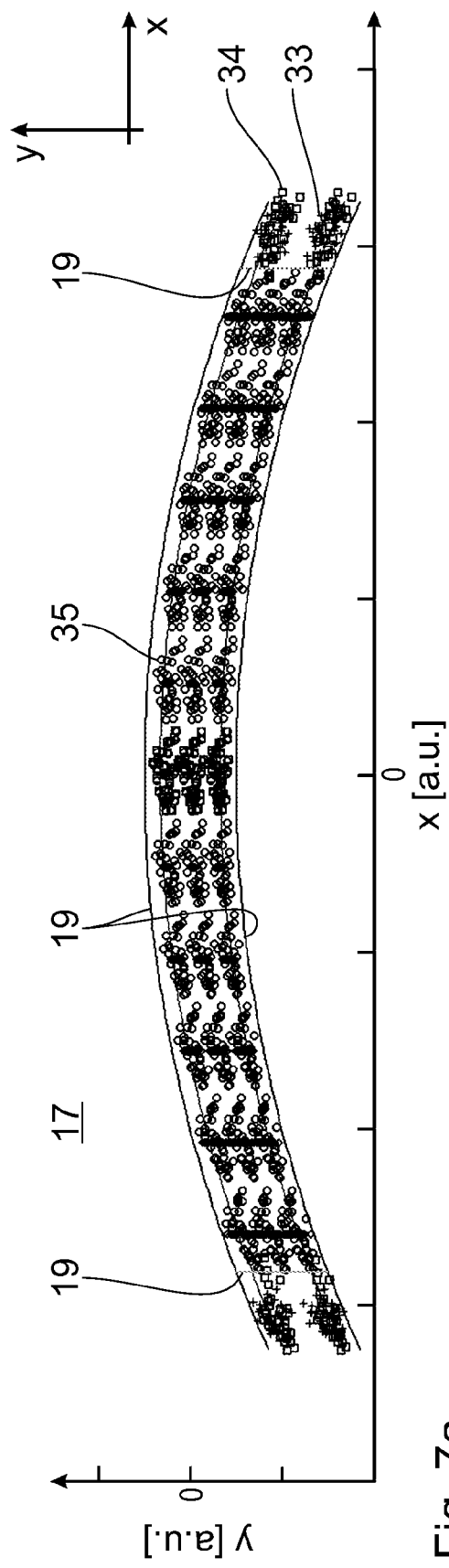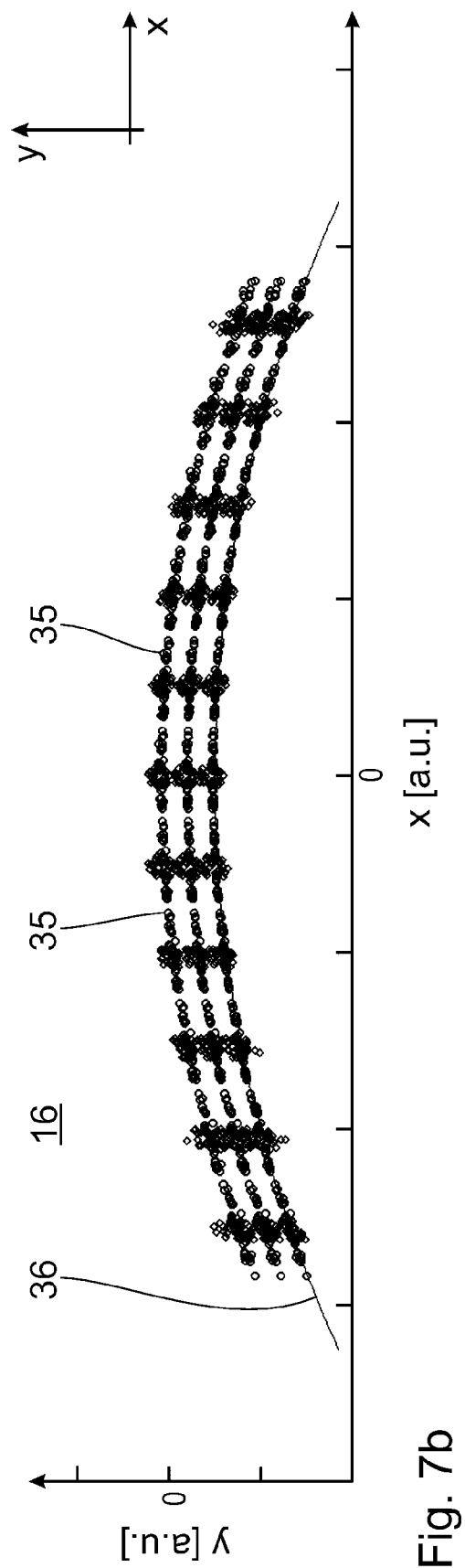
Fig. 7a
Fig. 7b

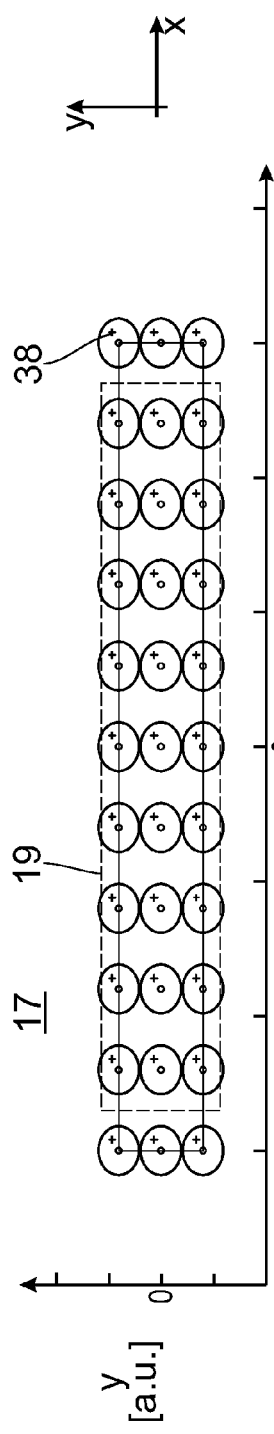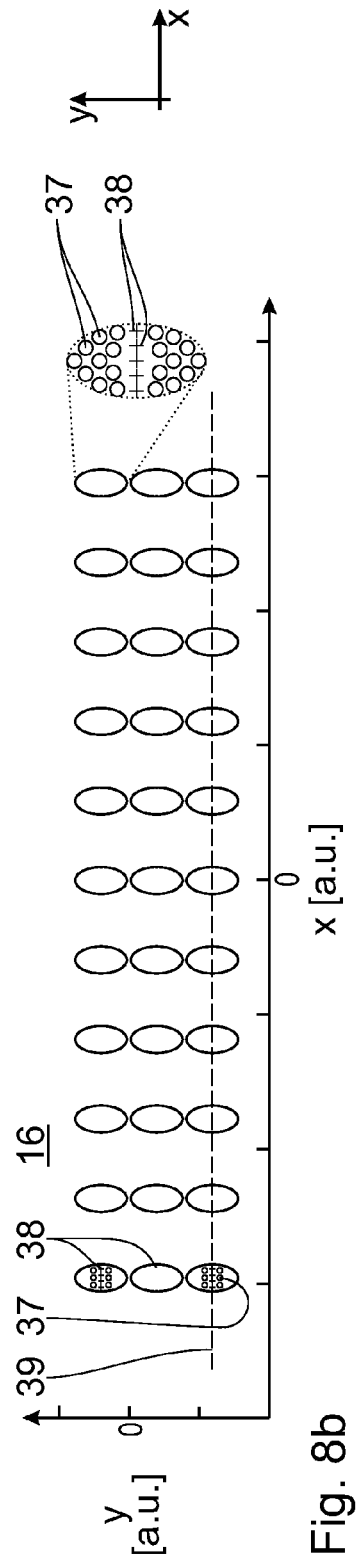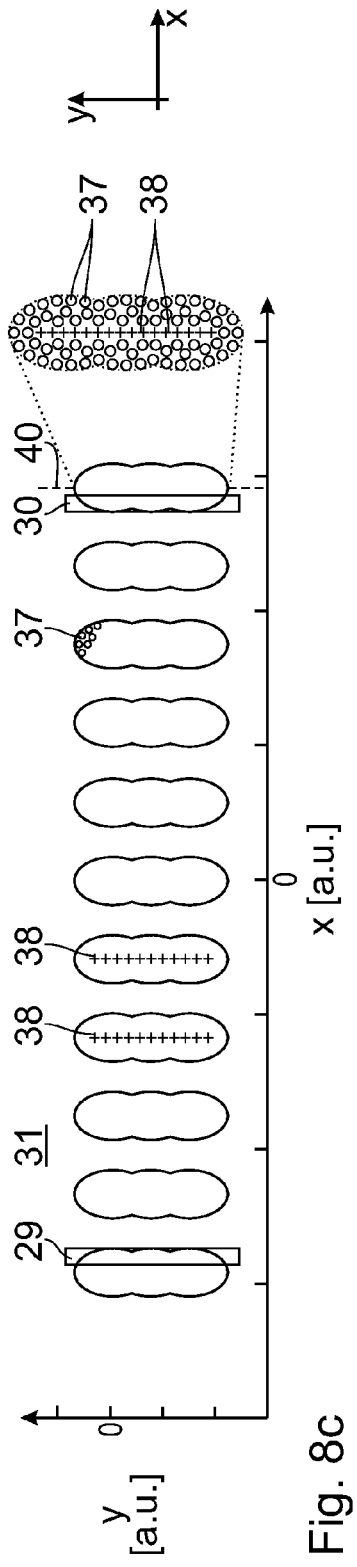
Fig. 8a
Fig. 8b
Fig. 8c

ILLUMINATION OPTICAL SYSTEM FOR PROJECTION LITHOGRAPHY

CROSS-REFERENCE TO RELATED APPLICATIONS

The present application is a continuation of, and claims benefit under 35 USC 120 to, international application PCT/EP2011/071714, filed Dec. 5, 2011, which claims benefit under 35 USC 119 of German Application No. DE 10 2010 062 779.8, filed Dec. 10, 2010 and under 35 USC 119(e) of U.S. Ser. No. 61/421,702, filed Dec. 10, 2010. The entire disclosure of each of these applications is incorporated by reference herein.

FIELD

The invention relates to an illumination optical system for projection lithography. Furthermore, the invention relates to an illumination system with an illumination optical system of this type, a projection exposure system with an illumination system of this type, a method for producing structured components and a structured component produced by a method of this type.

SUMMARY

An object of the present invention is to develop an illumination optical system of the type mentioned at the outset in such a way that an influencing and/or a monitoring of an illumination intensity distribution over the object field is made possible, as far as possible without influencing an illumination angle distribution.

This object is achieved according to the invention by an illumination optical system for projection lithography with an optical assembly for guiding illumination light to an object field to be illuminated in an object plane. The illumination optical system divides a bundle of the illumination light into a plurality of part bundles, which are allocated to various illumination directions of the object field illumination. The illumination optical system is configured in such a way that at least some of the part bundles are superimposed on one another: in a first superimposition plane according to a first superimposition specification; and in a second superimposition plane, which is spaced apart from the first superimposition plane, according to a second superimposition specification.

It was recognised according to the invention that an illumination optical system, which is configured in such a way that at least some of the part bundles are superimposed on one another in superimposition planes spaced apart from one another according to corresponding superimposition specifications, provides the possibility, on the one hand, of influencing the illumination light in one of the two superimposition planes to specify an illumination intensity distribution, without simultaneously undesirably influencing thereby an illumination angle distribution and, in the other of the two superimposition planes, providing an energy or intensity monitoring of the illumination light undisturbed by slight fluctuations of the part bundles. The invention is released from the demand of optimising a superimposition of the part bundles of the illumination light in precisely one plane. A specification of a superimposition in the two superimposition planes spaced apart from one another according to the two superimposition specifications increases the degrees of freedom with respect to a possible influencing and/or monitoring of the part bundles of the illumination light. The result is the possibility of an illumination, which can be reproduced well, of the object field within narrow predetermined tolerances.

An illumination optical system in which neither of the two superimposition planes coincides with the object plane leads to a further increase in the degrees of freedom in the illumination. It was recognised that, inasmuch as the superimposition specifications in the two superimposition planes that do not coincide with the object plane are adhered to, adhering to an exact superimposition specification in the object plane is not important. In the object plane, certain boundary conditions, for example, the impinging of the illumination light within a target region predetermined by the object field, merely have to be fulfilled in the superimposition.

An illumination optical system in which neither of the two superimposition planes is imaged in the object plane can be very compact and can be designed with a low number of optical components.

A superimposition of the part bundles in which at least some of the part bundles are superimposed on one another in the second superimposition plane according to the second superimposition specification in such a way that edges of the superimposed part bundles coincide, at least in portions, along edge lines, allows an influencing of the illumination light where the part bundles coincide, at least in portions, independently of the illumination angle or illumination direction.

An influencing of the part bundles of the illumination light in one of the superimposition planes, in particular an influencing independent of the illumination angle, can take place via a field intensity specification device arranged in one of the superimposition planes, which is an intensity specification plane, for adjusting an intensity distribution of the illumination light over the object field. The edges of the superimposed part bundles coincide, at least in portions along the edge lines, where they can be influenced by the field intensity specification device. A corresponding field intensity specification device is known from WO 2009/074 211 A1. The influencing of the part bundles of the illumination light can take place in the second superimposition plane.

At least one free region in which at least some of the part bundles are superimposed on one another in the first superimposition plane according to the first superimposition specification such that at least one free region within the first superimposition plane is completely free of part bundle edges ensures that slight displacements of the part bundles in the first superimposition plane within these free ranges do not lead to great changes in the impinging of the free regions or in the impinging of core regions located completely within the three regions with the illumination light.

A superimposition specification in which at least some of the part bundles are superimposed on one another in the first superimposition plane according to the first superimposition specification in a superimposition direction (x), which differs from a superimposition direction (y) according to the second superimposition specification, in such a way that edges of the superimposed part bundles coincide, at least in portions provides the possibility of influencing or monitoring the illumination light from a second direction independently of the illumination direction or the illumination angle. With regard to a reduction of sensitivity of the impingement in the first superimposition plane, that which was stated above in conjunction with the at least one free region applies.

An energy sensor with at least one sensitive sensor region which lies in the first superimposition plane allows a monitoring of the energy or intensity of the illumination light and/or a transmission of components located in front of the energy sensor and guiding the illumination light.

An arrangement of the at least one sensor region of the energy sensor lying within the free region or coinciding therewith ensures that slight displacements of the part bundles do not lead to great changes in the impingement of the sensor regions. This displacement is therefore not undesirably interpreted as a fluctuation of the efficiency of the light source or the transmission of the component guiding the illumination light.

The advantages of: an illumination system with a projection optical system for imaging the object field into an image field; a projection exposure system with such an illumination system; a method for producing a structured component which includes providing a wafer, on which a layer of a light-sensitive material is at least partially applied, providing a reticle, which has structures to be imaged, providing such a projection exposure system, and projecting at least a part of the reticle onto a region of the layer of the wafer with the aid of the projection exposure system; and a component produced in this way correspond to those, which were described above with reference to the illumination optical system. The light source may be an EUV light source with a useful light wavelength in the range between 5 nm and 30 nm. The projection exposure system is used for the lithographic production of a microstructured or nanostructured component.

BRIEF DESCRIPTION OF THE DRAWINGS

Embodiments of the invention will be described in more detail below with the aid of the drawings, in which:

FIG. 7a to c show in three graphs
a) a superimposition of part bundles of an illumination of an object field illuminated by the illumination optical system and arranged in a reticle plane, proceeding from a predetermined test point pattern on the field facets of the field facet mirror according to FIG. 6, shown in various illumination situations,
b) shows a corresponding superimposition of the part bundles, proceeding from the test point patterns in the plane of a field intensity specification device, also in various illumination situations, and
c) shows a superimposition of imaging beams of part bundles, which emanate from edge-side test point patterns of the field facets, in an energy sensor plane, also in various illumination situations;

FIG. 8a to c show, in a view similar to FIG. 7, the superimpositions of the imaging beams of the part bundles emanating from test point patterns on field facets of the field facet mirror according to FIG. 4, in turn in the object plane (a) in the plane of the field intensity specification device (b) and in the energy sensor plane (c);

DETAILED DESCRIPTION

Figure 1:
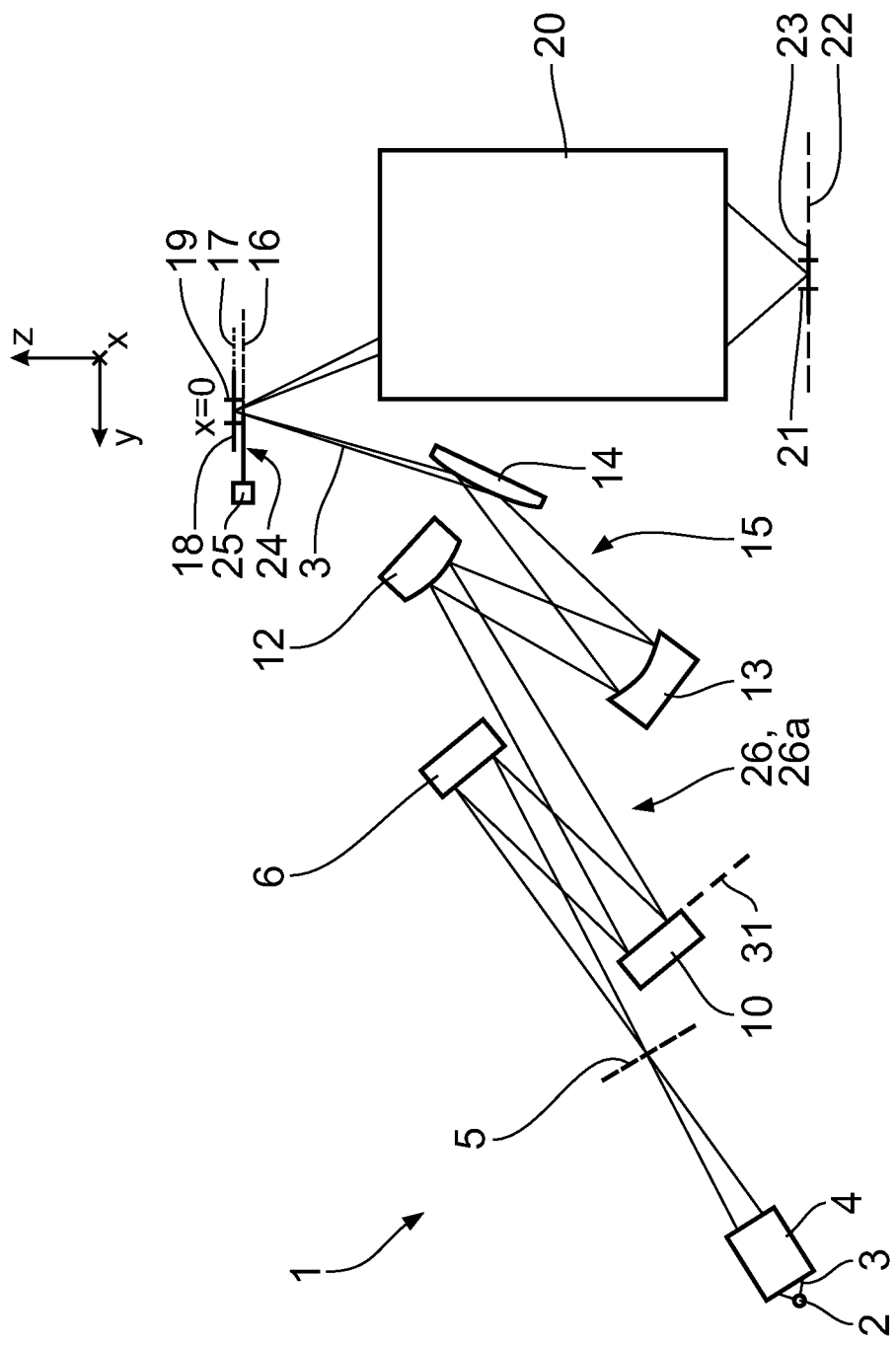
FIG. 1 shows a projection exposure system for microlithography, schematically and in relation to an illumination optical system in meridional section.

A projection exposure system 1 for microlithography is used to produce a microstructured or nanostructured electronic semiconductor component. A light source 2 emits EUV radiation in the wavelength range, for example, between 5 nm and 30 nm. A useful radiation bundle of illumination light 3 is used for illumination and imaging within the projection exposure system 1. The illumination light 3, after the light source 2, firstly runs through a collector 4, which may, for example, be a nested collector with a multi-shell structure known from the prior art, for example a Wolter optical system. After the collector 4, the illumination light 3 firstly passes through an intermediate focal plane 5, which can be used to separate the illumination light 3 from undesired radiation or particle fractions. After running through the intermediate focal plane 5, the illumination light 3 firstly impinges on a field facet mirror 6.

An xyz-coordinate system is drawn in the drawing, in each case, to facilitate the description of positional relationships. The x-axis runs perpendicular to the plane of the drawing and into it in FIG. 1. The y-axis runs to the left in FIG. 1. The z-axis runs upwardly in FIG. 1. A Cartesian local xyz- or xy-coordinate system will be used in each case in the following figures to facilitate the description of positional relationships in individual optical components of the projection exposure system 1. The respective local xy-coordinates span, if nothing else is described, a respective main arrangement plane of the optical components, for example a reflection plane or a field plane. The x-axes of the global xyz-coordinate system and the local xyz- or xy-coordinate systems run parallel to one another. The respective y-axes of the local xyz- or xy-coordinate systems have an angle to the y-axis of the global xyz-coordinate system, which corresponds to a tilting angle of the respective optical component about the x-axis.

Figure 4:
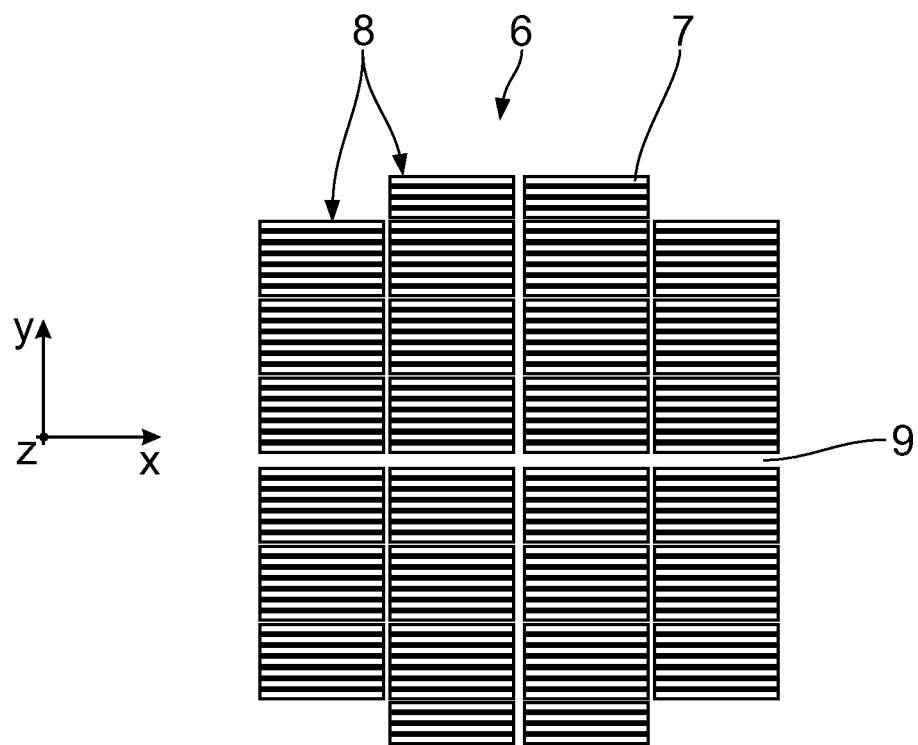
FIG. 4 shows a view of a facet arrangement of a facet mirror of the illumination optical system of the projection exposure system according to FIG. 1.

FIG. 4 shows, by way of example, a facet arrangement of field facets 7 of the field facet mirror 6. The field facets 7 are rectangular and in each case have the same x/y-aspect ratio. The field facets 7 predetermine a reflection face of the field facet mirror 6 and are grouped in four columns, each with six field facet groups 8. The field facet groups 8 generally in each case have seven field facets 7. The two edge-side field facet groups 8 of the two central field facet columns in each case have four additional field facets 7, so that these field facet groups 8 in total have eleven field facets 7. Between the two central facet columns and between the third and fourth facet line, the facet arrangement of the field facet mirror 6 has intermediate spaces 9, in which the field facet mirror 6 is shaded by holding spokes of the collector 4.

After reflection on the field facet mirror 6, the illumination light 3 divided into part bundles, which are allocated to the individual field facets 7, impinges on a pupil fact mirror 10.

Figure 5:
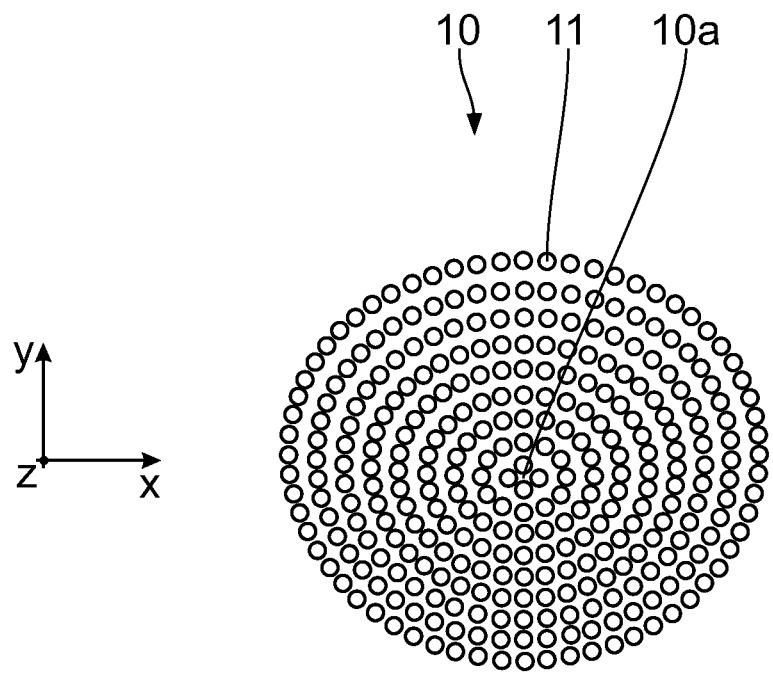
FIG. 5 shows a view of a facet arrangement of a pupil facet mirror of the illumination optical system of the projection exposure system according to FIG. 1.

FIG. 5 shows a facet arrangement, by way of example, of round pupil facets 11 of the pupil facet mirror 10. The pupil facets 11 are arranged around a centre 10a of the pupil facet mirror in facet rings located inside one another. A pupil facet 11 is allocated to each part bundle of the illumination light 3 reflected by one of the field facets 7, so that a respective facet pair that is impinged upon, with one of the field facets 7 and one of the pupil facets 11 specifies a beam guide channel or illumination channel for the associated part bundles of the illumination light 3. The part bundles thus produced are thus allocated to different illumination directions of an object field illumination.

The channel-wise allocation of the pupil facets 11 to the field facets 7 takes place depending on a desired illumination by the projection exposure system 1. To activate certain pupil facets 11, the field facet mirrors 7 are individually tilted about the x-axis, on the one hand, and, on the other hand, about the y-axis.

The field facets 7 are imaged in a field plane 16 of the projection exposure system 1 via the pupil facet mirror 10 and a following transmission optical system 15 consisting of three EUV mirrors 12, 13, 14. The EUV mirror 14 is configured as a grazing incidence mirror. Downstream of the field plane 16 and spaced apart in the z-direction by about 5 mm to 20 mm is a reticle plane 17, in which a reticle 18 is arranged, by which, with the illumination light 3, an illumination region is illuminated, which coincides with an object field 19 of a downstream projection optical system 20 of the projection exposure system 1. In the projection exposure system 1, the field plane 16, into which the field facets 7 are imaged by the transmission optical system 15 in facet images, and the reticle plane 17, which is simultaneously the object plane of the projection optical system 20, do not therefore coincide. The illumination light 3 is reflected by the reticle 18.

The projection optical system 20 images the object field 19 in the reticle plane 17 into an image field 21 in an image plane 22. Arranged in this image plane 22 is a wafer 23, which carries a light-sensitive layer, which is exposed during the projection exposure by the projection exposure system 1. During the projection exposure, both the reticle 18 and the wafer 23 are scanned in a synchronised manner in the y-direction. The projection exposure system 1 is configured as a scanner. The scanning direction will also be called the object displacement direction below.

A field intensity specification device 24, which will be described in more detail below, is arranged in the field plane 16. The field intensity specification device 24 is used to adjust an intensity distribution that is scan-integrated, in other words integrated in the y-direction, over the object field 19. The field plane 16 is thus simultaneously an intensity specification plane of the illumination optical system 26. The field intensity specification device 24 is activated by a control device 25.

The field facet mirror 6, the pupil facet mirror 10, the mirrors 12 to 14 of the transmission optical system 15 and the field intensity specification device 24 are components of an illumination optical system 26 of the projection exposure system 1. The components 6, 10, 12, 13 and 14 of the illumination optical system 26 are used to guide the illumination light 3 here.

No pupil plane of the illumination optical system 26 or the projection optical system 20 lies between the field plane 16 and the reticle plane 17.

Figure 2:
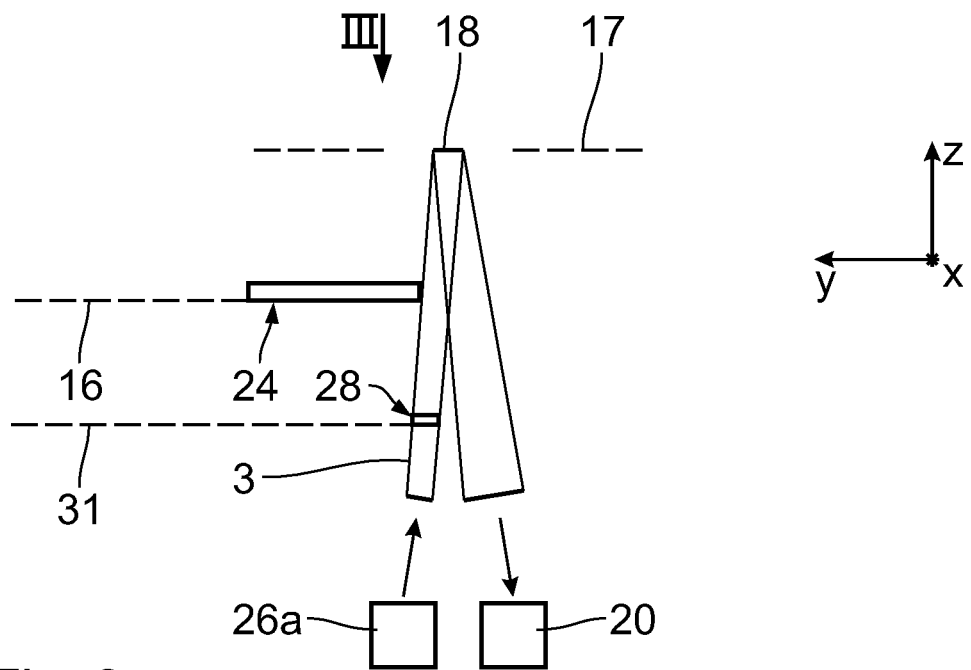
FIG. 2 shows a detailed enlargement from FIG. 1 in the region of a reticle plane.
Figure 3:
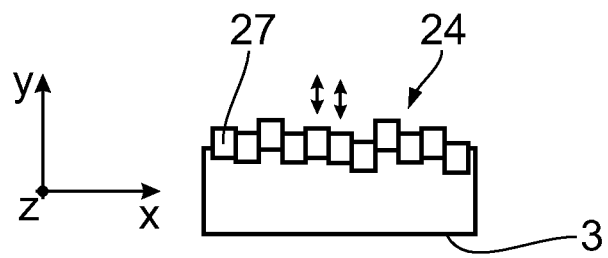
FIG. 3 shows a view of a field intensity specification device of the projection exposure system from the viewing direction III in FIG. 2.

FIGS. 2 and 3 show the field intensity specification device 24 in more detail. The field intensity specification device 24 has a plurality of finger-like individual stops 27 arranged next to one another. A total of twenty six individual stops 27 with a respective width of 4 mm are present in the configuration according to FIGS. 2 and 3, of which FIG. 3 schematically only shows some. These individual stops 27 are arranged directly adjacent to one another or else partly overlapping. In the case of a partial overlapping, adjacent individual stops 27 have to be located in planes as far as possible closely adjacent to one another perpendicular to the beam direction of the illumination light 3.

All the individual stops 27 are inserted into the useful radiation bundle of the illumination light 3 from one and the same side.

With the aid of the control device 25, the individual stops 27 can be adjusted independently of one another in the y-direction into a predetermined position. Depending on at what field height, in other words, in which x-position, an object point on the reticle 18 passes the object field 19, the scanning path of this object point in the y-direction and therefore the integrated illumination light intensity, which this object point experiences, is determined by the y-position of the respective individual stop 27. A homogenisation or a predetermined distribution of the useful radiation intensity illuminating the reticle 18 and subsequently, via the projection optical system 20, the wafer 23, can thus be achieved via a specification of the y-positions of the individual stops 27. The field intensity specification device 24 is also called a UNICOM.

An energy sensor 28 (cf. FIG. 2) with two sensor units 29, 30 (cf. FIG. 7c) is arranged in the beam path of the illumination light 3 in front of the field intensity specification device 24. The sensor units 29, 30 are designed as sensors sensitive to the illumination light 3, for example as CCD sensors equipped to detect EUV light, or CMOS sensors.

The energy sensor 28 is arranged in an energy sensor plane 31, which extends parallel to the field plane 16 and to the reticle plane 17, in other words also parallel to the xy-plane. The energy sensor plane 31 is spaced apart from the reticle plane 17 at a spacing in the z-direction of about 20 mm to 80 mm. In the x-direction, the sensor units 29, 30 are just outside the x-values, over which the object field 19 extends. An energy monitoring of the illumination light 3, which reaches the reticle plane 17, takes place with the sensor units 29, 30. The energy sensor 28 in the process absorbs fractions of the illumination light 3, which are not used to expose the reticle 18, but would illuminate regions lying next to the structure to be imaged, in other words next to the region of the reticle 18 to be exposed. Using the energy sensor 28, a monitoring, on the one hand, of the efficiency of the light source 2 and, on the other hand, of the reflectivities or transmissions of the components guiding the illumination light between the light source 2 and the reticle 18 is possible.

Neither the field plane 16 nor the energy sensor plane 31 is an image plane of the reticle plane 17. Accordingly, none of these planes 17, 31 is imaged in the object plane 17 of the projection optical system 20.

Figure 6:
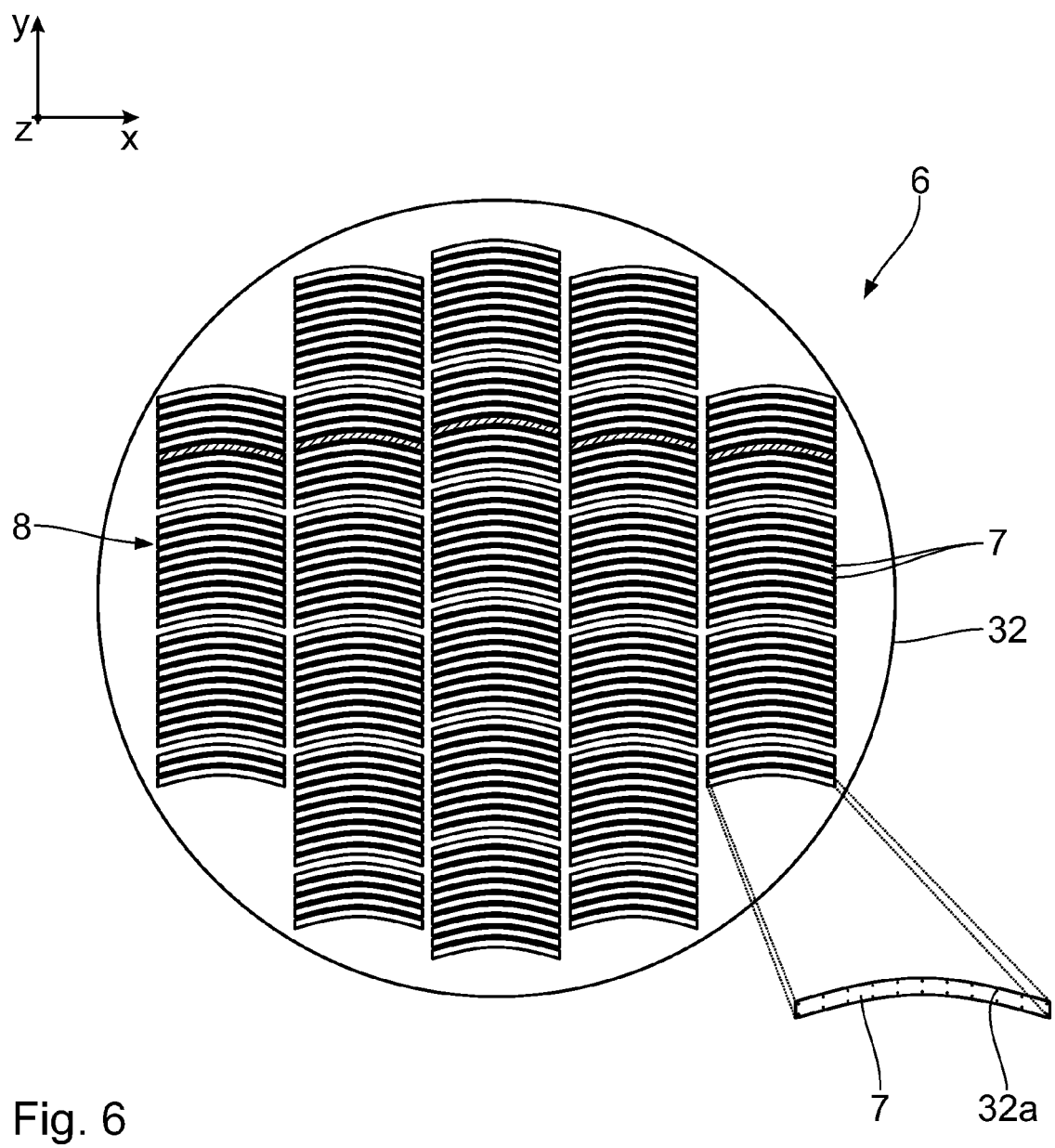
FIG. 6 shows a facet arrangement of a further configuration of a field facet mirror with a first allocation of a test point pattern in a view similar to FIG. 4.

FIG. 6 shows a further configuration of a field facet mirror 6. Components which correspond to those, which have already been described above with reference to the field facet mirror 6 according to FIG. 4, have the same reference numerals and will only be described, inasmuch as they differ from the components of the field facet mirror 6 according to FIG. 4. The field facet mirror 6 according to FIG. 6 has a field facet arrangement with curved field facets 7. These field facets 7 are arranged in a total of five columns each with a plurality of field facet groups 8. The field facet arrangement is entered in a circular limitation of a carrier plate 32 of the field facet mirror.

The field facets 7 of the configuration according to FIG. 6 all have the same area and the same ratio of width in the x-direction and height in the y-direction, which corresponds to the x/y aspect ratio of the field facets 7 of the configuration according to FIG. 4.

Figure 7C:
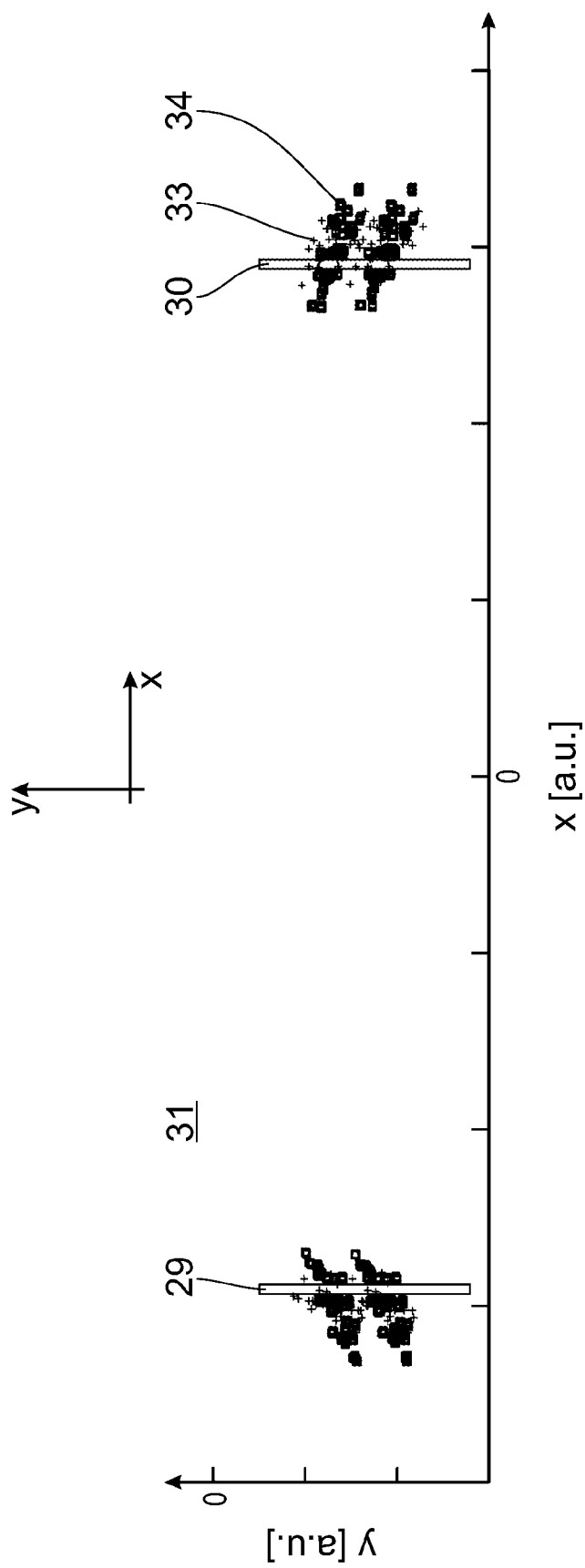

FIG. 7 shows superimposition ratios of the various part bundles of the illumination light 3, which emanate from the individual field facets 7. In the arrangement according to FIG. 7, the field plane 16, in other words the arrangement pane of the field intensity specification device 24, has a spacing of 15 mm from the reticle plane 17. The energy sensor plane 31 has a spacing of 40 mm from the reticle plane 17. FIG. 7b in this case shows the superimposition ratios in the reticle plane 17. FIG. 7b shows the superimposition ratios in the field plane 16, in other words in the arrangement plane of the field intensity specification device 24. FIG. 7c shows the superimposition ratios in the energy sensor plane 31. Impingement points of beams of the part bundles of the illumination light 3, which emanate from test point patterns, arranged the same in each case, on the field facets 7, are shown in each case. A corresponding test pattern of imaging beams 32a is shown in the insert of FIG. 6 enlarging one of the field facets 7. The test pattern 32a contains two test point rows, each with eleven test points, which in each case divide a contour of the respective field facet 7 uniformly. Alternatively, a three-line test pattern may also be used, in which a third row of test points dividing a centre line of the field facet 7 is also present between the two edge-side lines. Three-row test patterns of this type are used in the graphs of FIGS. 7 and 8 described below. In particular, in the superimposition of the test patterns of the individual field facets 7, still unoptimised, the arrangement of the test points in three rows each with eleven test points can still be guessed at (cf. the rhombuses). In the unoptimised superimposition according to FIG. 7a, strips of the test points belonging to the various field facets 7 can be seen close to edges of the object field 19 with positive and negative x-values.

FIG. 7a shows, with positive x-values and with negative x-values, in each case beyond the edges of the object field 19, shown by + signs, the superimposition of beams of the illumination light 3, which emanate from the test point patterns of the field facets 7, in a first, still unoptimised illumination situation. Each of the + signs (cf. 33 in FIGS. 7a and 7c) designates the point here, at which an illumination beam emitted in each case from a corner of the field facet 7 passes through the reticle plane 17 (cf. FIG. 7a) and impinges on the energy sensor plane 31 (cf. FIG. 7c). Some of these impingement points 33 lie within the sensitive regions of the sensor unit 29, 30 of the energy sensor 28 indicated by rectangles in FIG. 7c. A situation of this type is to be avoided, as slight fluctuations of the part bundles of the illumination light 3 reflected in the region of the corners of the field facets 7 then lead to a part bundle 3 of this type still just reaching the respective sensitive region of the sensor unit 29, 30 or not reaching it any longer. Slight fluctuations of these part bundles 3 impinging on the edge side on the sensor units 29, 30 in the x-direction would then undesirably lead to large fluctuations of the energy impinging on the sensor unit 29, 30.

Impingement points of the beams of the illumination light 3 shown in FIGS. 7a and 7c by squares 34, the beams in turn emanating from the test point patterns on the field facets 7, proceeding from the unoptimised illumination situation, show a pre-optimised illumination situation. The pre-optimisation takes place by tilting the pupil facets 11 about the y-axes of their respective local xy-coordinate systems according to a first superimposition specification and a displacement resulting therefrom of the images of the individual field facets 7 in the x-direction in such a way that the imaging beams, which emanate from the corners of the field facets 7, specifically do not impinge on the sensitive regions of the sensor unit 29, 30. Accordingly, no single one of the impingement points 34 lies in the sensitive regions of the sensor unit 29, 30 of the energy sensor 28 in FIG. 7c.

The first superimposition specification thus relates to the superimposition of the part bundles of the illumination light 3, which are allocated to the field facets 7, in the energy sensor plane 31, in other words in a first superimposition plane. According to the first superimposition specification, the part bundles of the illumination light 3 are thus superimposed on one another in the energy sensor plane 31, in other words in such a way that at least one free region, namely the sensitive region of the sensor unit 29, 30 within the energy sensor plane 31, is completely free of part bundle edges.

Impingement points shown in FIGS. 7a and 7b by circles 35, of the beams of illumination light 3, which are in turn emitted from the test point patterns on the field facets 7, correspond to a completely optimised illumination situation. The complete optimisation takes place with the aid of a second superimposition specification, the above-mentioned first superimposition specification still retaining validity as an additional condition.

The second superimposition specification relates to the superimposition of the part bundles of the illumination light 3 in the field plane 16, in other words in a second superimposition plane. This second superimposition specification is achieved by a displacement of the images of the individual field facets 7 in the field plane 16 both in the x-direction and in the y-direction, which is in turn achieved by corresponding tilting of the pupil facets 11, on the one hand, about the x-axis and, on the other hand, about the y-axis of the respective local xy-coordinate system of the respective pupil facet 11. The images of the field facets 7 and, accordingly, the impingement points 35 in the field plane 16 are displaced in such a way that good edge-side superimposition in the y-direction of edges of the field facet images is achieved, for example a good superimposition of the facet image edges along an edge line 36, which is shown in FIG. 7b. According to the second superimposition specification, the part bundles are superimposed on one another in the field plane 16, in other words such that edges of the superimposed part bundles coincide, at least in portions, along the edge line 36. A displacement specification of this type by x- and y-displacement of the individual facet images is described in WO 2010/037453 A. This superimposition allows a uniform action of the individual stops 27 of the field intensity specification device 24 for all the part bundles of the illumination light 3, as described in WO 2009/074 211 A1. The second superimposition specification contains, as an additional condition, that after the ending of the displacement of the facet images according to the second superimposition specification, the edges of the part bundles allocated to the field facets 7 do not come to rest on the sensitive regions of the sensor units 29, 30. The first superimposition specification is therefore contained as an additional condition in the second superimposition specification. There applies as a further additional condition of the second superimposition specification that the impingement points 35 may not leave the object field 19 in the reticle plane 17.

The superimposition direction according to the first superimposition specification is the x-direction. The superimposition direction according the second superimposition specification is primarily the y-direction.

With the aid of FIG. 8, in a view, which corresponds to that according to FIG. 7, a further superimposition situation is described using an illumination optical system with a field facet mirror 6 according to FIG. 4. Accordingly, in the reticle plane 17 (cf. FIG. 8a), in the field plane 16 (cf. FIG. 8b) and in the energy sensor plane 31 (cf. FIG. 8c), rectangular part bundles are superimposed, which emanate from the rectangular field facets 7 of the field facet mirror 6 according to FIG. 4. The superimposition of beams of the illumination light 3, which emanate from test point patterns on the field facets 7, are in turn shown in the three planes 17, 16, 31 in FIG. 8. Each of the field facets 7 of the field facet mirror 6 according to FIG. 4 has a test point pattern here, which is constructed as an x/y-grid from eleven columns running along the y-direction, each with three equidistant test points and three lines of test points running equidistantly to one another from the x-direction, in other words from a total of 33 test points.

Components which correspond to those, which have already been described above with reference to FIGS. 1 to 7, have the same reference numerals and will not be discussed again in detail.

Two illumination situations, namely a firstly not yet optimised superimposition of the part bundles, which are shown by circles 37, and an optimised superimposition situation in accordance with the two superimposition specifications, shown by plus signs 38, are shown in FIG. 8. This basic illustration via circles and plus signs, which reproduce impingement points of the beams of the illumination light 3 proceeding from the test point structures, corresponds to the view according to FIG. 7. "Exemplary clouds", from which the distribution of the circles 37 and eight plus signs 38 emerges within the mutually superimposed test point structures, are emphasised enlarged and schematically thinned out in FIGS. 8b and 8c.

Those test points, which are allocated to the greatest x-values in the positive x-direction, and those test points, which are allocated to the smallest x-values in the negative x-direction, are located on regions of the field facets 7, from which illumination light 3 is reflected, which is not used to illuminate the object field 19, but primarily to impinge upon the sensor units 29, 30.

In the optimised superimposition situation (plus sign 38), which in turn takes place with the aid of the two superimposition specifications described above in conjunction with FIG. 7, the sensor regions of the sensor units 29, 30 in turn remain free of part bundle edges (no plus signs 38 located in the sensor regions), in other words are free regions. In addition, in the field plane 16 in the y-direction, the bundle edges lie on a common edge line 39, so that a part bundle-independent effect of the field intensity specification device 24 is ensured. Finally, the parts of the part bundles used to illuminate the object field 19 lie within the object field 19, which is reproduced by a dashed rectangle in FIG. 8a.

In the optimised superimposition situations, which are shown by the plus signs 38 in FIGS. 8a, 8b and 8c, the part bundles of the illumination light 3 are superimposed on one another in the energy sensor plane 31 according to the first superimposition specification in the x-direction, which differs from the superimposition direction in the y-direction according to the second superimposition specification, in such a way that the edges of the superimposed part bundles of the illumination light 3 coincide, at least in portions. The edges of the part bundles of the illumination light 3, in the energy sensor plane 31 in the x-direction, therefore have a common edge line 40. The edges of the part bundles of the illumination light 3, in the field plane 16, in other words in the arrangement plane of the field intensity specification device 24 thus have, in the y-direction, the common edge line 39.

With the aid of FIGS. 9 and 10, a further embodiment of an illumination geometry of facets of a facet mirror will be described in the manner of the field facet mirror 6 according to FIG. 6. Components which correspond to those, which have already been described above with reference to FIGS. 1 to 8 and, in particular with reference to FIG. 6, have the same reference numerals and will not be discussed again in detail.

Figure 9:
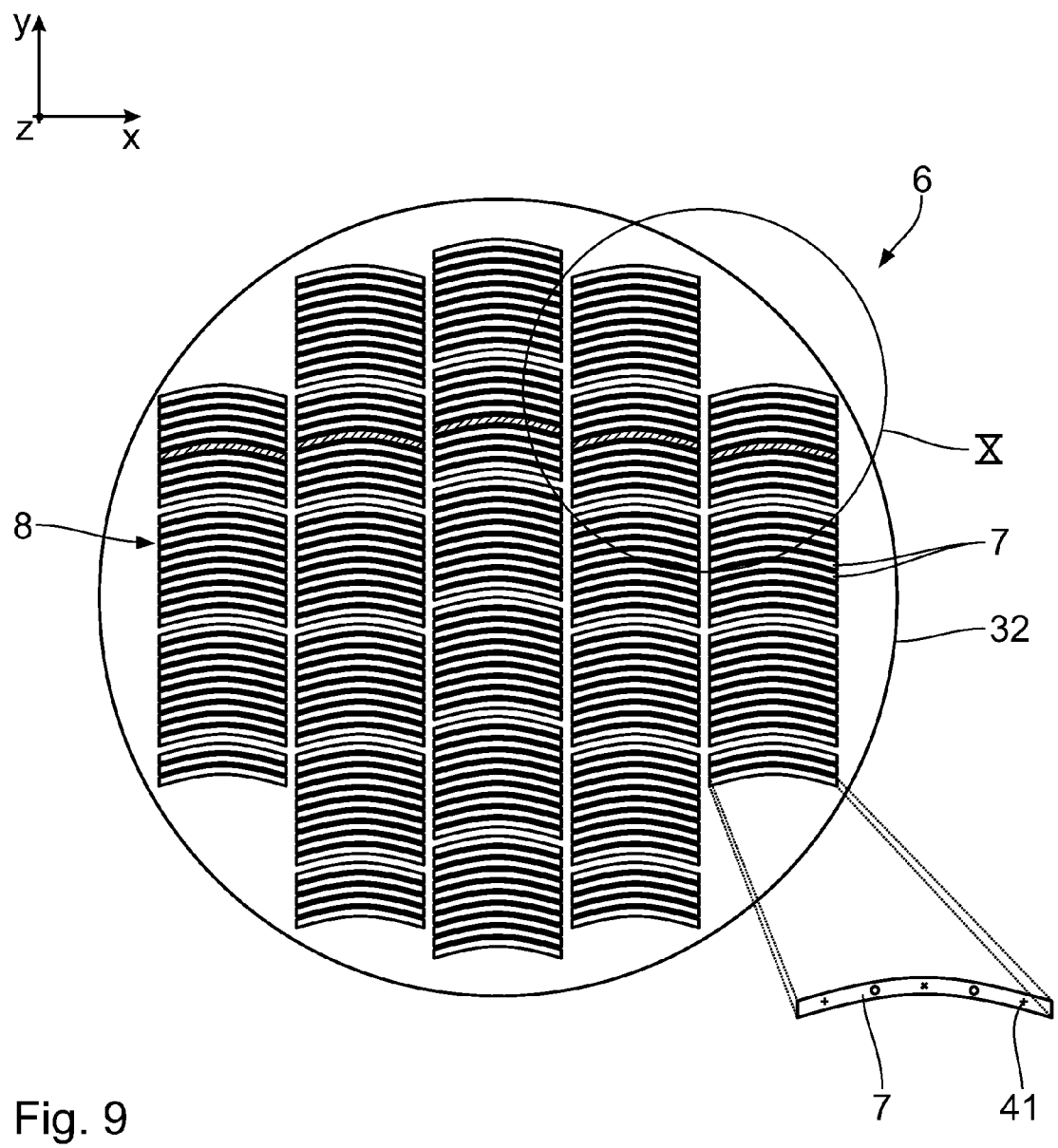
FIG. 9 shows, in a view similar to FIG. 6, the field facet mirror with an alternative allocation of a test point pattern.

An enlarged insert in FIG. 9 shows a test pattern of impingement points of beams of a part bundle of the illumination light 3 on a selected field facet as an arrangement of test points 41, these impingement points of the test pattern, in other words the test points, being imaged on the respective same field points in the object field 19. The allocation of the test points 41 of the test pattern according to FIG. 9 is therefore different to the allocation in the test pattern 32a according to FIG. 6. In the test pattern 32a, impingement points, which identically correspond to one another with respect to their position on the field facets 7, on the various field facets 7, are observed, which, optionally in accordance with the respective superimposition specification, displaced relative to one another in the x- and/or y-direction, come to rest in the object field 19 in the reticle plane 17, in the field plane 16, or in the energy sensor plane 31. In the test pattern with the test points 41, the observation takes place in the reverse direction. Those patterns of test points 41 of the various field facets 7, which are in each case imaged on the same points in the object field 19, are now observed.

Figure 10:
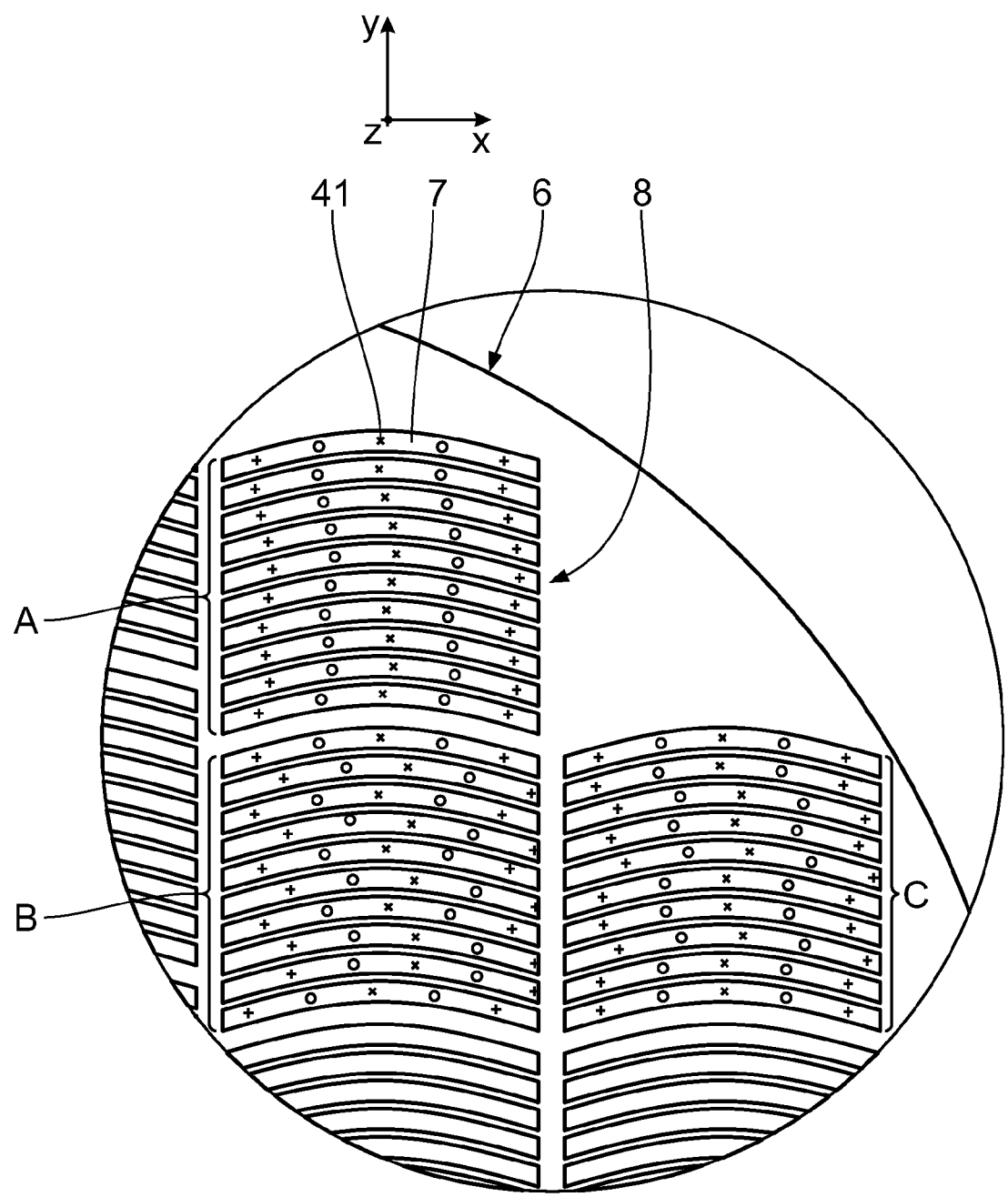
FIG. 10 shows a detailed enlargement according to Detail X from FIG. 9.

FIG. 10 shows an exemplary distribution of the test points 41 on the field facets 7 of some facet groups of the field facet mirror 6.

Test points 41 with the point symbol "+" are imaged here on the left-hand and the right-hand edge of the object field 19 in the x-direction. Test points 41 with the point symbol "x" are imaged in the centre of the object field 19. Test points 41 with the point symbol "o" are imaged centrally in the respective field half of the object field 19.

All of the test points 41 are, in each case, when adjacent field facets 7 are observed, displaced by a certain amount in the x-direction with respect to one another. This x-displacement amount may also be zero in adjacent field facets 7.

In the facet group designated "A" in FIG. 10, only a small x-displacement takes place in each case between two adjacent field facets 7.

A clear displacement of the measuring points 41 in the x-direction takes place in the facet group B between adjacent field facets 7, this displacement partially following a zigzag line, viewed over the field facets 7 of the facet groups B.

The x-displacements within the facet group C follow a pattern, which can be understood as a mixture of the x-displacement patterns in the field groups A and B.

Because of the x displacement according to FIGS. 9 and 10, not all the regions of field facets 7 with the same x-coordinates contribute to the illumination of one and the same x-facet coordinates in the object field 19. The x-displacement thus leads to an averaging of the x-positions of the field facets 7, in each case impinged upon by the illumination light, over the object field 19. If, for example, a specific x-position on the field facets 7 is impinged upon with a lower illumination light intensity or is even shaded, the described x-displacement leads to the fact that the reduced or even shaded illumination does not act completely on the object field at the same x-position.

In the projection exposure, the reticle 18 and the wafer 22, which carries a coating that is light-sensitive to the EUV illumination light 3, is provided. At least one portion of the reticle 18 is then projected onto the wafer 23 with the aid of the projection exposure system 1. Finally, the light-sensitive layer exposed with the EUV illumination light 3 is developed on the wafer 23. In this manner, the microstructured or nanostructured component, for example a semiconductor chip, is produced.

The invention claimed is:

1. An illumination optical system, comprising:
   an optical assembly configured so that, during use of the illumination optical system, the optical assembly guides illumination light to an object field in an object plane; and
   an energy sensor comprising a sensor region,
   wherein the illumination optical system is configured so that, during use of the illumination optical system:

the illumination optical system divides a bundle of the illumination light into a plurality of part bundles which are allocated to various illumination directions of the object field illumination; and at least some of the part bundles are superimposed on one another:

in a first superimposition plane according to a first superimposition;

in a second superimposition plane according to a second superimposition, the second superimposition plane being spaced apart from the first superimposition plane;

neither the first superimposition plane nor the second superimposition plane coincides with the object plane, and wherein the sensor region is in the first superimposition plane, and the illumination system is a projection lithography illumination system.

2. The optical system of claim 1, wherein, during use of the optical system, neither the first superimposition plane nor the second superimposition plane is imaged in the object plane.

3. The optical system of claim 1, wherein, during use of the optical system, at least some of the part bundles are superimposed on one another in the second superimposition plane so that edges of the superimposed part bundles coincide, at least in portions, along edge lines.

4. The optical system of claim 3, wherein, during use of the optical system, neither the first superimposition plane nor the second superimposition plane is imaged in the object plane.

5. The optical system of claim 1, further comprising a device arranged in the second superimposition plane so that, during use of the optical system, the device adjusts an intensity distribution of the illumination light over the object field so that edges of the superimposed part bundles coincide, at least in portions along edge lines, where they are influenced by the device.

6. The optical system of claim 5, wherein, during use of the optical system, at least some of the part bundles are superimposed on one another in the second superimposition plane so that edges of the superimposed part bundles coincide, at least in portions, along edge lines.

7. The optical system of claim 5, wherein, during use of the optical system, neither the first superimposition plane nor the second superimposition plane is imaged in the object plane.

8. The optical system of claim 1, wherein, during use of the optical system, at least some of the part bundles are superimposed on one another in the first superimposition plane so that at least one free region within the first superimposition plane is completely free of part bundle edges.

9. The optical system of claim 8, wherein, during use of the optical system, neither the first superimposition plane nor the second superimposition plane is imaged in the object plane.

10. The optical system of claim 8, wherein the sensor region of the energy sensor lies within the at least one free region or coincides therewith.

11. The optical system of claim 1, wherein, during use of the optical system, at least some of the part bundles are superimposed on one another in the first superimposition plane according to the first superimposition in a superimposition direction, which differs from a superimposition direction according to the second superimposition, so that edges of the superimposed part bundles coincide, at least in portions.

12. An illumination system, comprising:
the illumination optical system of claim 1; and
a projection optical system configured to image the object field into an image field.

13. A projection exposure system, comprising:
an EUV light source;
the illumination optical system of claim 1; and
a projection optical system configured to image the object field into an image field.

14. A method of using a system comprising an illumination optical system and a projection optical system, the method comprising:
using the illumination system to illumination at least a part of a reticle; and
using the projection optical system to project at least the part of the reticle onto a light-sensitive material,
wherein the illumination optical system is an illumination optical system according to claim 1.

15. An illumination optical system, comprising:
an optical assembly configured to guides illumination light to an object field in an object plane so that the illumination optical system divides a bundle of the illumination light into a plurality of part bundles which are allocated to various illumination directions of the object field illumination, at least some of the part bundles are superimposed on one another: a) according to a first superimposition in a first superimposition plane; and b) according to a second superimposition in a second superimposition plane which is spaced apart from the first superimposition plane; and
an energy sensor comprising a sensor region in the first superimposition plane,
wherein:
the illumination optical system is configured so that neither the first superimposition plane nor the second superimposition plane coincides with the object plane; and
the illumination system is a projection lithography illumination system.

16. The illumination optical system of claim 15, further comprising a device in the second superimposition plane and configured to adjust an intensity distribution of the illumination light over the object field so that edges of the superimposed part bundles coincide, at least in portions along edge lines, where they are influenced by the device.

17. The illumination optical system of claim 15, wherein the illumination optical system is configured so that neither the first superimposition plane nor the second superimposition plane is imaged in the object plane.

18. The illumination optical system of claim 15, wherein the illumination optical system is configured so that at least some of the part bundles are superimposed on one another in the second superimposition plane so that edges of the superimposed part bundles coincide, at least in portions, along edge lines.

19. The illumination optical system of claim 15, wherein the illumination optical system is configured so that at least some of the part bundles are superimposed on one another in the first superimposition plane so that at least one free region within the first superimposition plane is completely free of part bundle edges.

20. The illumination of optical system of claim 19, wherein the sensor region of the energy sensor lies within the at least one free region or coincides therewith.

21. The illumination optical system of claim 15, wherein the illumination optical system is configured so that at least some of the part bundles are superimposed on one another in the first superimposition plane according to the first superimposition in a superimposition direction, which differs from a superimposition direction according to the second superimposition, so that edges of the superimposed part bundles coincide, at least in portions.

22. An illumination system, comprising:
the illumination optical system of claim 15; and
a projection optical system configured to image the object field into an image field.

23. A projection exposure system, comprising:
an EUV light source;
the illumination optical system of claim 15; and
a projection optical system configured to image the object field into an image field.

24. A method of using a system comprising an illumination optical system and a projection optical system, the method comprising:
using the illumination system to illumination at least a part of a reticle; and
using the projection optical system to project at least the part of the reticle onto a light-sensitive material,
wherein the illumination optical system is an illumination optical system according to claim 15.

* * * * *

UNITED STATES PATENT AND TRADEMARK OFFICE
CERTIFICATE OF CORRECTION

| | | |
|---|---|---|
| PATENT NO. | : 9,110,378 B2 | Page 1 of 1 |
| APPLICATION NO. | : 13/894120 | |
| DATED | : August 18, 2015 | |
| INVENTOR(S) | : Jens Ossmann, Martin Endres and Ralf Stuetzle | |

It is certified that error appears in the above-identified patent and that said Letters Patent is hereby corrected as shown below:

Claims

Col. 12, line 57, claim 20, delete "illumination of optical" and insert -- illumination optical --.

Signed and Sealed this
Twenty-third Day of February, 2016

Michelle K. Lee
*Director of the United States Patent and Trademark Office*